US008822036B1

(12) United States Patent
Wereszczak (10) Patent No.: US 8,822,036 B1
(45) Date of Patent: Sep. 2, 2014

(54) SINTERED SILVER JOINTS VIA CONTROLLED TOPOGRAPHY OF ELECTRONIC PACKAGING SUBCOMPONENTS

(71) Applicant: UT-Battelle, LLC, Oak Ridge, TN (US)

(72) Inventor: Andrew A. Wereszczak, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 13/787,366

(22) Filed: Mar. 6, 2013

(51) Int. Cl.
*B23K 1/06* (2006.01)
*H01L 23/10* (2006.01)
*H01L 23/00* (2006.01)

(52) U.S. Cl.
CPC ............... *H01L 23/10* (2013.01); *H01L 24/80* (2013.01)
USPC ..... 428/609; 228/120; 228/173.1; 228/173.2; 228/208

(58) Field of Classification Search
USPC .......... 428/209, 344, 609; 174/251, 254, 255; 228/120, 173.1, 173.2, 208
See application file for complete search history.

(56) References Cited

U.S. PATENT DOCUMENTS

| | | | | |
|---|---|---|---|---|
| 4,529,667 | A * | 7/1985 | Shiga et al. | 428/646 |
| 4,894,752 | A * | 1/1990 | Murata et al. | 361/813 |
| 5,139,890 | A * | 8/1992 | Cowie et al. | 428/670 |
| 5,510,197 | A * | 4/1996 | Takahashi et al. | 428/670 |
| 6,352,634 | B1 * | 3/2002 | Forderer et al. | 205/181 |
| 6,596,947 | B1 * | 7/2003 | Kurita et al. | 174/255 |
| 7,026,059 | B2 * | 4/2006 | Suzuki et al. | 428/626 |

OTHER PUBLICATIONS

Sabbah et al., "Evaluation of silver-sintering die attach," *Conference on Integrated Power Systems (CIPS)*, Nuremberg, Germany, Version 1, 7 pp. (Mar. 2012).
Wereszczak, "Ceramic and Glass Strength-Size Scaling," AAE Colloquium: Andrew A. Wereszczak, Ph.D.—School of Aeronautics and Astronautics, 1 p. (Feb. 2010).
Wereszczak et al., "Properties of Bulk Sintered Silver as a Function of Porosity," ORNL/TM-2012/130, pp. i-v and 1-31 (Mar. 2012).
Wereszczak, "Heavy Vehicle Propulsion Materials," *FY 2004 Progress Report*, pp. 187-209 (Jan. 2004).
Wereszczak et al., "Sintered Silver Joint Strength Dependence on Substrate Topography and Attachment Pad Geometry," $7^{th}$ *International Conference on Integrated Power Electronics Systems (CIPS)*, Nuremburg, Germany, 6 pp. (Mar. 2012).
Wereszczak et al., "Size-Scaling of Tensile Failure Stress in a Hot-Pressed Silicon Carbide," *International Journal of Applied Ceramic Technology*, vol. 7, pp. 635-642 (Apr. 2010).

* cited by examiner

*Primary Examiner* — Cathy Lam
(74) *Attorney, Agent, or Firm* — Klarquist Sparkman, LLP (57) ABSTRACT

Disclosed are sintered silver bonded electronic package subcomponents and methods for making the same. Embodiments of the sintered silver bonded EPSs include topography modification of one or more metal surfaces of semiconductor devices bonded together by the sintered silver joint. The sintered silver bonded EPSs include a first semiconductor device having a first metal surface, the first metal surface having a modified topography that has been chemically etched, grit blasted, uniaxial ground and/or grid sliced connected to a second semiconductor device which may also include a first metal surface with a modified topography, a silver plating layer on the first metal surface of the first semiconductor device and a silver plating layer on the first metal surface of the second semiconductor device and a sintered silver joint between the silver plating layers of the first and second semiconductor devices which bonds the first semiconductor device to the second semiconductor device.

20 Claims, 5 Drawing Sheets

Gold Plated Substrates:
Grinding Direction Perpendicular
to Tensile Testing Direction Lead Frames Were
Pulled Off in This Direction Silver Plated Substrates:
Grinding Direction Parallel
to Tensile Testing Direction Lead Frames Were
Pulled Off in This Direction

FIG. 7

SINTERED SILVER JOINTS VIA CONTROLLED TOPOGRAPHY OF ELECTRONIC PACKAGING SUBCOMPONENTS

ACKNOWLEDGMENT OF GOVERNMENT SUPPORT

This invention was made with government support under Contract No. DE-AC05-00OR22725 awarded by the U.S. Department of Energy. The government has certain rights in the invention.

FIELD

Disclosed are sintered silver bonded electronic package subcomponents having modified metal layer surfaces and methods for making the same.

BACKGROUND

The joining of electronic packaging subcomponents, such as die attachment, typically employs soldering. Soldered joints are often favored because they can be easily-processed at temperatures below the tolerable levels for semiconductor devices, particularly those of silicon. However, soldering uses metal alloys that unlike most pure metals, have relatively low electrical and thermal conductivities. They are also prone to fatigue and failure due to intermetallic compound formation and phase separation, which cause deformations leading to bonding caused failures such as crack initiation during temperature cycles. Furthermore, only a few solder alloys have high enough melting points to potentially work above 250° C. and those that do are much more expensive than ordinary solder.

With the commercial availability of wide-bandgap semiconductor devices such as SiC or GaN, there is an increasing need for higher temperature die attachment processes since solder alloys do not provide the adequate high-temperature performance and reliability.

SUMMARY

Given the shortcomings of solder die attachment, there is interest in alternative bonding materials and techniques. Silver has superior electrical and thermal conductivities. Low-temperature fired silver pastes are recently of some limited use for the die-attachment of semiconductor devices due to its ability to withstand higher temperatures and thus provide better thermomechanical reliability than solder die attachment. While having some superior characteristics as compared to solder, sintered silver joints involve a solid state process rather than the molten metal process of soldering. As such, sintered silver bonding faces problems not of concern with soldering, such as the effect of surface texture (topography) of the underlying metal layer on the semiconductor devices being joined. While soldering is primarily a chemical bonding of the metal layers of joined semiconductor devices, sintered silver bonding primarily bonds the metal layers of the devices via mechanical bonding.

The sum of chemical and mechanical bonding limits the adhesive strength of die-attach and substrate-attach layers. Chemical bonding is dictated by numerous parameters associated with the compatibility of the metallurgical bond of the two mating surfaces and the processing history that brings them together. In the present invention the efficacy of the mechanical bonding has been determined to be affected by the topographies (e.g., roughness and texture) of the two adjoined surfaces.

Disclosed are sintered silver bonded electronic packaging subcomponents, comprising a first electronic subcomponent comprising a substrate, a first metal layer having a first metal surface and a second metal surface with the second metal surface formed on or connected to the substrate, wherein the first metal surface includes a modified topography, and a first silver plating layer formed on the modified first metal surface; a second electronic subcomponent comprising a second metal layer having a first metal surface and a second metal surface, and a sintered silver joint connecting the first electronic subcomponent to the second electronic subcomponent at the first silver plating layer and the second metal layer.

In some embodiments the sintered silver bonded electronic packaging subcomponent further comprises a second silver plating layer formed on the first metal surface of the second metal layer such that the sintered silver joint connects the first electronic subcomponent to the second electronic subcomponent at the first and second silver plating layers. In some embodiments the sintered silver bonded electronic packaging subcomponent has a first metal surface of the second metal layer including a modified topography. In some embodiments the sintered silver bonded electronic packaging subcomponent includes uniaxially ground modified topography of the first metal surface of the first and/or second metal layer. In other embodiments the modified topography of the first metal surface of the first and/or second metal layer is grid sliced. In yet other embodiments the modified topography of the first metal surface of the first and/or second metal layer is grit blasted. In some embodiments the modified topography of the first metal surface of the first and/or second metal layer is grid sliced in a crisscross configuration or is chemically etched.

In certain embodiments the uniaxially ground first metal surface has uniaxial channels formed therein and the channels of the first electronic subcomponent first metal surface are positioned perpendicular to a tensile force direction to be experienced by the bonded first and second electronic subcomponents. In some embodiments the first and or second electronic subcomponents comprise a DBC or DBA.

Also disclosed are methods for bonding electronic subcomponents comprising providing a first electronic subcomponent comprising a substrate, a first metal layer having a first metal surface and a second metal surface with the second metal surface formed on or connected to the substrate, modifying the topography of the first metal surface of the first metal layer, providing a second electronic subcomponent having a second metal layer having a first metal surface and a second metal surface, applying a silver paste to the first metal surface of the first or the second electronic subcomponent, pressing the second electronic subcomponent to the first electronic subcomponent with the silver paste therebetween, and sintering the first and second electronic subcomponents with the silver paste therebetween forming a sintered silver joint connecting the first electronic subcomponent to the second electronic subcomponent.

In certain embodiments of the methods the first metal surfaces of the first and second metal layers are plated before applying the silver paste thereto. In certain embodiments the method further comprises modifying the first metal surface of the first and or second metal layers by uniaxially grinding, grit blasting, chemically etching, or slicing the first and/or second metal surface before plating the first metal surface.

DETAILED DESCRIPTION

Embodiments of the present invention include surprisingly superior mechanical bonds formed through modification of the topographies of metal surfaces, such as copper cladding or aluminum surfaces on direct bonded copper (DBC) or direct bonded aluminum (DBA) ceramic substrates, respectively, of electronic subcomponents. While this disclosure discusses primarily DBCs, including ceramic substrates, certain embodiments of the invention are applicable to other electronic subcomponents metal surfaces on ceramic or other substrates. Embodiments of the sintered silver bonded electronic package subcomponents have surprisingly superior shear strength.

Disclosed are sintered silver bonded electronic package subcomponents (sintered silver bonded "EPS") and methods for making the same. Embodiments of the sintered silver bonded EPSs include topography modification of one or more metal surfaces of semiconductor devices bonded together by the sintered silver joint. Embodiments of the sintered silver bonded EPSs include a first semiconductor device having a first metal surface, the first metal surface having a modified topography that has been chemically etched, grit blasted, uniaxially ground and/or grid sliced, connected to a second semiconductor device which may also include a first metal surface with a modified topography, a silver plating layer on the modified first metal surface of the second semiconductor device and a sintered silver joint between the silver plating layers of the first and second semiconductor devices which bonds the first semiconductor device to the second semiconductor device.

Also disclosed are methods of making the sintered silver bonded electronic package subcomponents for packaging semiconductor devices.

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of ingredients, properties such as roughness measurements, percentages, and so forth, as used in the specification or claims are to be understood as being modified by the term "about." Unless otherwise indicated, non-numerical properties, such as grinding direction, as used in the specification or claims are to be understood as being modified by the term "substantially," meaning to a great extent or degree. Accordingly, unless otherwise indicated, implicitly or explicitly, the numerical parameters and/or non-numerical properties set forth are approximations that may depend on the desired properties sought, limits of detection under standard test conditions/methods, limitations of the processing method, and/or the nature of the parameter or property. When directly and explicitly distinguishing embodiments from discussed prior art, the embodiment numbers are not approximates unless the word "about" is recited.

Die Attach (also known as Die Mount or Die Bond) is the process of attaching a silicon chip to the die pad or die cavity of a support structure (e.g., a lead frame) of a semiconductor package.

Sintered Joint or Sintered Bond—an interconnected and strong layer or interphase whose final solid form was created by the sintering process and includes characteristics of a sintered processed joint.

Topography—the general configuration of a surface.

Solder—to join by means of a metal alloy used when melted to join metallic surfaces.

Sintering is a solid-state process where sufficiently high temperatures (typically above ~0.4 of the homologous melting temperature of a material—depending upon the material, as known to those skilled in the art) activates atomic diffusion in a material that results in inter-particle metallic, ionic, or covalent bonding of a powderized material or powderized compact. There is no melting, unlike that for solder processing. Concurrently applied pressure increases the diffusion rate of sintering.

Solid state—the condition of a substance in which it is a solid.

Shear strength—the maximum shear stress to which a material can withstand without rupture, delamination or debonding of two connected surfaces.

Plating—forming a thin, adherent layer of metal on an object.

Uniaxial—of, relating to, or affecting one axis or one direction.

Electronic Packaged Subcomponent (EPS)—also referred to herein as an "electronic subcomponent" and in some instances, a "semiconductor device" is recited synonymously therewith, is an electronic subcomponent having a metal layer surface for joining to another metal later of a different electronic subcomponent.

Certain embodiments of the sintered silver bonded EPSs disclosed herein comprise any two electronic subcomponent devices which include metal surfaces available for joinder to one another via a sintered silver bond.

Figure 1:
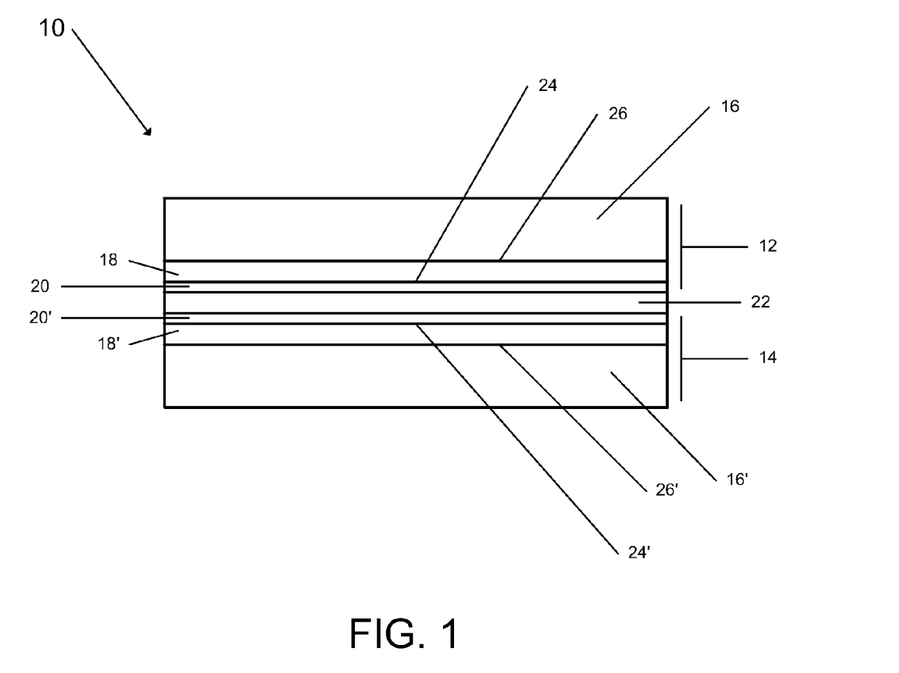
FIG. 1 an embodiment of the disclosed sintered silver bonded electronic package subcomponents.

In one embodiment as shown in FIG. 1, the sintered silver bonded electronic package subcomponent 10, comprises a first semiconductor device 12 having a substrate 16, a first metal layer 18 and a first silver plating layer 20. The first metal layer 18 includes a first metal surface 24 and a second metal surface 26 with the second metal surface formed on or connected to the substrate 16. The first metal surface 24 includes a modified topography (not shown in FIG. 1). The first semiconductor device 12 further comprises a silver plating layer formed on the modified first surface 24 of the first metal layer 18. The second semiconductor device 14 of the sintered silver bonded EPS 10 includes a second metal layer 18' having first and second metal surfaces 24', 26', and a second silver plating layer 20' formed on the first metal surface 24'. The first metal surface 24' includes a modified topography (not shown in FIG. 1). The second metal layer 18' may be formed on or connected to a substrate 16'. The sintered silver bonded EPS 10 further comprises a sintered silver joint 22 connecting the first semiconductor device 12 to the second semiconductor device 14, at the first and second silver plating layers 20, 20'.

The first metal surfaces 24, 24' have modified topographies to increase the mechanical strength of the sintered silver joint EPS 10. The modification of the metal surface changes the topography of the metal layer to increase mechanical interlocking between the metal layer surface and the silver plating layer such that the mechanical bond of the sintered silver joint is strengthened. In principle, two adjoining surfaces that have a surface roughness greater than zero have the potential to exhibit mechanical interlocking with one another. In this invention, one or both of the surfaces are manipulated to increase the mechanical interlocking. A well-polished surface can be considered to have a surface roughness of substantially zero or zero. The effectiveness of that mechanical interlocking will be dependent on (1) the magnitude of their surface roughnesses, (2) whether the surface roughnesses of the two surfaces are in phase or are mating, and (3) whether the surfaces have an in-plane repeating uniaxial or biaxial topographical habit, structure, or pattern. In certain embodiments the modified topography comprises a modified metal surface that has been etched, grit blasted, uniaxially ground and/or grid sliced or otherwise modified to increase the roughness of the surface in a manner to increase the strength of the bond.

The metal layers 18, 18', while primarily bonding electronic package subcomponents having copper layers (such as DBCs), may comprise any suitable metal layer to be bonded, such as aluminum (in, for instance, DBAs). The metal layers vary in thickness depending upon the type of electronic subcomponents being bonded.

Figure 2:
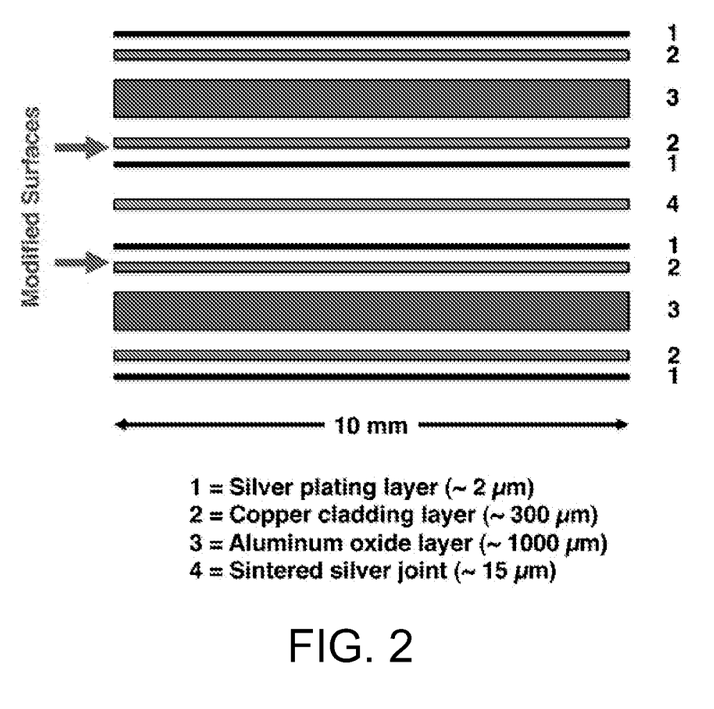
FIG. 2 is an exploded view schematic of an embodiment of the disclosed sintered silver bonded electronic package subcomponents.

Another embodiment of the disclosed sintered silver bonded EPS, as shown in FIG. 2, comprises a sintered silver bonded EPS having two direct bonded copper devices connected by a sintered silver joint. The DBCs each include a silver plating layer 1, a metal layer comprising a copper cladding layer 2, and a substrate comprising an aluminum oxide layer 3. The sintered silver bonded EPS further comprises a sintered silver joint 4 bonding the DBCs to one another. The DBCs may further comprise additional silver plating layers 1 and copper cladding layers 2 on opposite surfaces of the aluminum oxide layer substrates 3 such that each of the substrates 3 includes a copper cladding layer 2 on each surface of the substrate 3 with silver plating layers 1 on each of the metal layers, thereby forming a multilaminate structure or DBC sandwich with a sintered silver joint 4. The metal layers comprising copper cladding layers 2, on either side of the sintered silver joint 4 have surfaces with modified topographies for connection to the silver plating layers 1 which in turn connect to the sintered silver joint.

The silver plating layer 20 is formed on the metal layer 18 after the metal layer surface is modified. The silver plating layers 20 preferably have a thickness of from 0.5 µm to 10 µm, or from 1 µm to 3 µm, or 2 µm, such that the silver plating layer completely covers the modified surface of the metal layer 18. Although the present disclosure focuses on use of silver to create the disclosed sintered silver bonded EPCs, the plating layer material comprises the appropriate compatible metal for the underlying modified metal layer surface, as known to those of ordinary skill in the art. For example, if the electronic component to be bonded or attached is a DBA, a thin layer of Ni, Pd, or Au might be used.

Once the metal layer surface is modified as described below, the silver plating layer is formed on the metal modified layer typically by electroplating or electroless plating. Other suitable plating methods known to those skilled in the art, may be used for certain embodiments.

The sintered silver joint 22 (FIG. 1) may comprise a sinterable silver paste, such as the silver pastes available from commercial manufacturers, such as Cookson (Suwanee, Ga.), Dowa (Japan), Henkel (Rancho Dominguez, Calif.), and Heraeus (West Conshohocken, Pa.). For example, a nanoscale or micron size particle silver paste may be used, such as from 30 nm nanosilver particles to a few microns, mixed with an organic binder system or other appropriate binder, with a silver loading of for example, at least 50%, 60%, 70%, 80%, 90% or more. The silver paste can be readily deposited by common surface mount techniques such as screen/stencil printing, spray deposition or syringe dispensing.

In certain embodiments of the sintered silver bonded EPS, the modified topography of the metal surface 24 (FIG. 1) comprises a uniaxially ground metal layer surface. The uniaxial ground surface comprises a metal surface that has been ground unidirectionally. The topography of a uniaxial ground surface has a corrugated or sinusoidal-like structure in one direction. The peaks and troughs should have an amplitude that is less than the average thickness of the sintered silver bond. A range of average thicknesses of sintered silver bond could be 2 to 200 µm, or 2 to 100 µm, or 2 to 50 µm, or less than 100 µm, so the roughness of the uniaxially ground surface is preferably less than any average value thickness within that range. The ground modified surface provides strength anisotropy (i.e., shear strength different depending on whether the ground surface is placed parallel or perpendicular to the grinding direction). This anisotropy results in uniaxial ground topographies because shearing is more difficult when loading is perpendicular to the aligned grinding-induced peaks and troughs rather than parallel to them.

Figure 3:
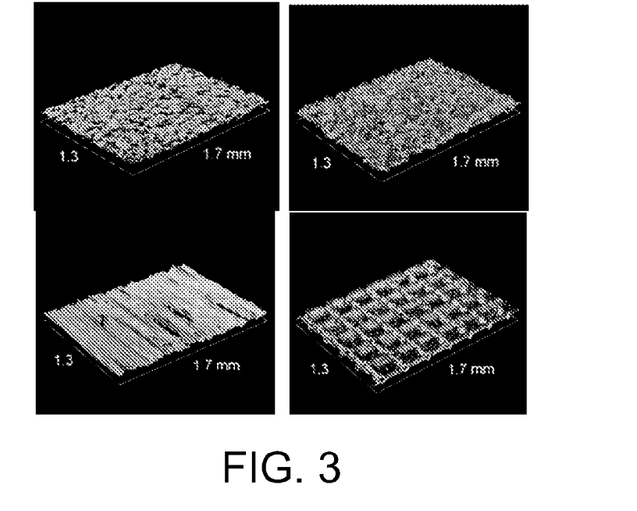
FIG. 3 are optical profiler images of embodiments of the modified copper surfaces on DBCs: etched (upper left), grit blasted (upper right), uniaxial ground (lower left), and grid sliced (lower right). These are small sample regions from the overall 64 mm$^2$ printed area.

In certain embodiments of the sintered silver bonded EPS, the modified topography of the metal surface 24 (FIG. 1) comprises an etched metal layer surface. Such a surface will have a mottled appearance or will have a surface with a "patched islands" appearance (such as shown in FIG. 3). For example, to modify the surface of a metal layer to be attached, one could use most any of the conventional etchants as known to those skilled in the art.

In yet other particular embodiments of the sintered silver bonded EPS, the modified topography of the metal surface 24

(FIG. 1) comprises a grit blasted metal layer surface. A grit blasted surface is also mottled but its local depressions have a dimple-like appearance somewhat similar to that on a golf ball as shown in FIG. 3. For grit blasted surface, a powderized hard material (typically a ceramic such as aluminum oxide) is introduced into a high-speed air stream. The introduced hard particles, moving at a high rate of speed, impact the relatively soft metallic surface creating dimples whose size is a fraction the size of the hard particles.

In another particular embodiment of the sintered silver bonded EPS, the modified topography of the metal surface 24 (FIG. 1) comprises a grid sliced metal layer surface (see FIG. 3). A modified metal surface comprising a grid sliced metal surface includes shallow slices into the metal layer, such as into a copper cladding layer, in a pattern such as a square grid. As can be appreciated, other designs may be useful. In general, embodiments having orthogonal slices or channels provide good results. The grid slicing may comprise mechanical grid slicing, such as use of a thin slicing wheel or other methods, such as chemical etching.

The slicing depth is in part determined by the thickness of the metal layer of the electronic component to be attached. The slices preferably have sufficient depth and breadth to accommodate the entry of the printed silver paste and the silver particle size that comprises the paste. However, the slices preferably are not so deep (e.g., more than 10-20% the average thickness of the sintered silver layer) that the silver paste does not fill its channel and enable mechanical interlocking. The slicing depth is typically not so deep as to cause the silver plating layer to be discontinuous over the metal layer surface and should be sufficiently shallow (have a sufficient aspect ratio) such that the silver plating can be formed therein. The slicing pattern may be formed by dicing or slicing saw blades. Stamping or even selective or masked chemical etching may alternatively or additionally be used.

It has been found that the sintered joint of attached EPSs according to the present invention can be further strengthened by mounting EPSs having modified surfaces with, for example, uniaxial channels formed therein such that the channels are positioned perpendicular to the tensile force direction to be experienced by the bonded components.

Silver sintering is performed by conventional means known to those of ordinary skill in the art. A silver (or other metal) powder is mixed with an organic-based deflocculent, surfactant, and/or other agents to enable rheological control to form a paste. The silver paste preferably has a composition of silver by weight at least 50%, 60%, 70%, 80%, 90% or greater. The silver paste once applied is sintered by well-known sintering processes known to those of ordinary skill in the art.

Some embodiments of the sintered silver bonded EPSs of the present invention have improved shear strength, such as at least a 10%, 20%, 30%, 40%, 50% greater than the shear strength for the same device without any modification of the metal surface layer. Some embodiments have shear strengths of sintered silver joints greater than that of solder joints at upwards of 100-200% stronger than that of solder. Additionally, sintered silver is elastic (i.e., does not permanently deform) at much higher shear strains than solder is; solder will plastically (permanently) deform at lower shear strains than sintered silver.

Shear strength is tested by: a mechanical test instrument that applies in-plane shear to a laminated test coupon using, for instance one may use a Shear Test Instrument or a Bond Tester Model 4000, available from Nordson-Dage, Fremont, Calif.; or a Royce 650 Universal Bond Tester, Royce Instruments, Napa, Calif.; or a Model Condor 150, from XYZTEC, Panningen, The Netherlands.

EXAMPLES

A DBC sandwich was used as a test coupon. The DBC sandwich comprising squares sliced from a commercially available DBC substrate (obtained from Curamik, Addison, Tex.), were silver plated and then joined using a commercially available sinterable silver paste.

The DBC substrates had nominal dimension of 10×10 mm and a total thickness of 1.6 mm (comprised of 0.3-mm-thick copper claddings bonded to 1.0-mm-thick aluminum oxide ceramic plate).

Electroless or immersion silver plating was performed to deposit 1-2-μm-thick silver onto the DBC surfaces. A commercially available silver paste (LTS 016-01P1, W. C. Heraeus GmbH, Hanau, Germany) developed for pressure-assisted sintering, was used.

The matrix of copper cladding surface modification is shown in Table 1. Five different metal surface modifications were prepared and tested, and their utilization to bond two silver-plated DBC coupons is schematically shown in FIG. 2.

TABLE 1

| Case | Copper Cladding Surface Condition |
| --- | --- |
| 1 | Polished |
| 2 | Chemically Etched |
| 3 | Grit Blasted |
| 4 | Uniaxial Ground |
| 5 | Grid Sliced |

Each of these cases have unique metal surface modifications (see FIG. 3). Case 1 involves the use of metallographically polished DBCs. The polishing deconvolutes chemical (or metallurgical) bonding and the strength from mechanical bonding. DBC sandwiches that included polished surfaces provided little or no mechanical bonding to the overall joint shear strength.

Case 2 is a chemically or gas-etched DBC surface as provided by the manufacturer, Curamik (Addison, Tex.).

Case 3 is a grit-blasted surface modification performed by the silver plate using aluminum oxide grit. The surface was grit-blasted with alumina powder whose average size was smaller than 150 micrometers.

Case 4 includes a uniaxial grinded surface performed with an 80-grit wheel on a conventional surface grinder that grinds using a reciprocal grinding motion with a spinning high speed grinding wheel. Such surface grinding is simple and in certain embodiments can introduce strength anisotropy (i.e., shear strength different parallel or perpendicular to the grinding direction). In this example, shear testing direction was perpendicular to the grinding direction. The anisotropy is reduced or eliminated in certain embodiments by using rotary grinding instead of uniaxial grinding.

Case 5 includes a grid diced modified metal surface having shallow slices into copper cladding in a square grid using a thin slicing wheel. The parallel slices were positioned 250 μm apart and the slicing was performed by using a thin dicing wheel, mounted on a surface grinder, which was used to introduce the slices or slots. Such slicing may instead be performed by rolling such a pattern onto copper cladding. Slicing may instead be performed by laser scribing, preferential chemical etching, stamping, a rolling process (like a "pizza cutter" process), or other suitable means.

Cases 2-5 provide relatively low-cost surface modification processes, and can be employed in an industrial setting to produce high shear strengths of the sintered joints at a lower cost.

The locations of the modified surfaces within the DBC sandwich are indicated in FIG. 2. All five of these cases are adjoined with a single square silver pad whose dimensions are 8×8 mm (64 mm$^2$). Surface roughnesses, measured before and after silver plating, of each of these five sets are listed in Table 2 as a comparison.

TABLE 2

Roughness measurements of the five different topography conditions.

| Copper Cladding Characteristic | Ra (μm) | Rt (μm) |
|---|---|---|
| Polished; | 0.4 | 3.6 |
| After plating | 0.4 | 5.8 |
| As-received; | 2.0 | 32.2 |
| After plating | 2.8 | 36.0 |
| Grit blasted; | 2.0 | 24.9 |
| After plating | 2.6 | 32.2 |
| Uniaxial ground; | 0.8 | 8.7 |
| After plating | 0.8 | 19.4 |
| Grid sliced; | 3.4 | 28.3 |
| After plating | 10.4 | 68.6 |

Ra is average roughness and Rt is difference between minimum depth and maximum height. Each measurement is made over 2.2 mm$^2$.

At least three DBC sandwiches for each of the five cases listed in Table 1 were processed to include a sintered silver joint. The wet pads of silver paste were approximately 20-25 μm thick. The silver paste pads were then dried in ambient air at 100° C. for one hour. They were then immediately combined and aligned with a mating DBC whose copper cladding surface condition was identical to that thereon.

The combined DBCs, separated by the unsintered dried silver pad, were positioned within a self-contained heater having two thermocouples and passive mechanical alignment fixture, and that entire assembly was positioned within the work area of an electromechanical test machine. The test coupons were heated to 280° C. in 10 minutes. A pressure of 30 MPa was then applied and maintained for 10 minutes while at 280° C. Cross-head displacement was continually monitored and its movement (while maintaining 30 MPa) tended to reach an asymptote of zero displacement change after approximately 5 minutes indicating that the sintering process (and its associated densification) reached saturation in that time. The compressive load was then removed and the heater turned off and the sintered DBC sandwich cooled. This process was repeated to complete the Table 1 matrix.

Figure 4:
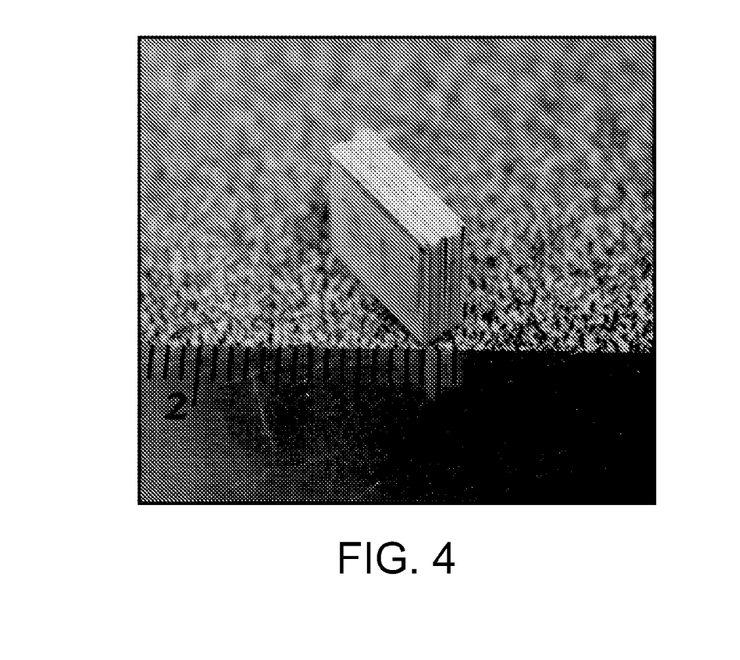
FIG. 4 is an embodiment of the invention showing a DBC bonded with a silver sintered joint.
Figure 5:
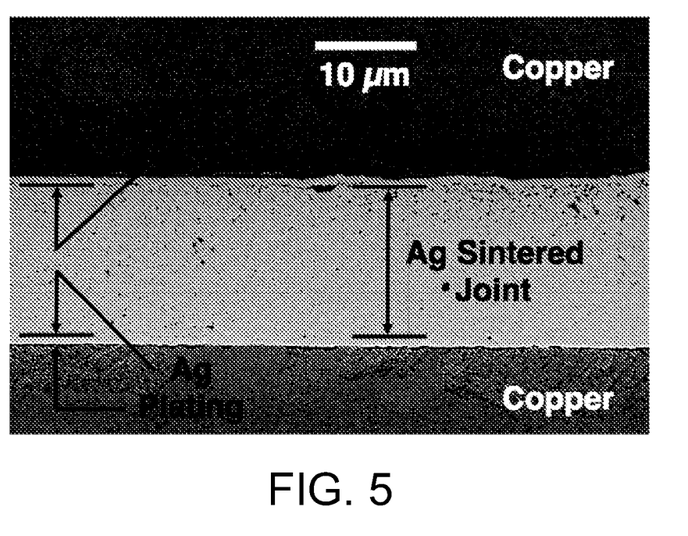
FIG. 5 is a polished cross-section of an embodiment of the silver sintered joint showing the thin silver plating on the DBCs.

An example of a joined DBC sandwich is shown in FIG. 4, and an example of a produced sintered joint is shown in FIG. 5. The thickness of the sintered silver layer was approximately 15 μm.

Shear strength testing was performed using a custom-made fixture that incorporated a built-in alignment feature that was passively activated during mechanical loading. This promoted unidirectional shear loading of the joint. A displacement rate of 0.2 mm/min was used for the testing and failure was produced in less than 1 minute for all tests. The maximum force was measured for every test, and then maximum shear stress was calculated using that force value divided by 64 mm$^2$. Loading direction for the shear testing was randomly chosen for all cases except for the uniaxial ground DBC sandwiches, where the loading direction was purposely oriented perpendicular to the grinding direction (the direction of the channels formed in the surface of the metal layer).

The shear strength test results are shown in Table 3. The shear strength of the sintered joint with polished copper surfaces is illustrative of the deconvoluted chemical adhesive strength in the joint. Its average shear strength was ~10 MPa. The higher shear strengths achieved with all other surface modifications is believed to be a consequence of additive strength from extra mechanical bonding with a topologically modified copper surface.

TABLE 3

| Copper Cladding and Joint Characteristics | Average Shear Strength (MPa) | Std Dev Shear Strength (MPa) | Minimum Shear Strength (MPa) |
|---|---|---|---|
| Polished, | 10.7 | 1.0 | 9.9 |
| Chemically etched | 24.3 | 9.7 | 15.3 |
| Grit Blasted | 29.2 | 11.1 | 16.3 |
| Uniaxial Ground, | 51.7 | 11.0 | 39.0 |
| Grid Sliced | 41.6 | 5.8 | 35.5 |

Figure 7:
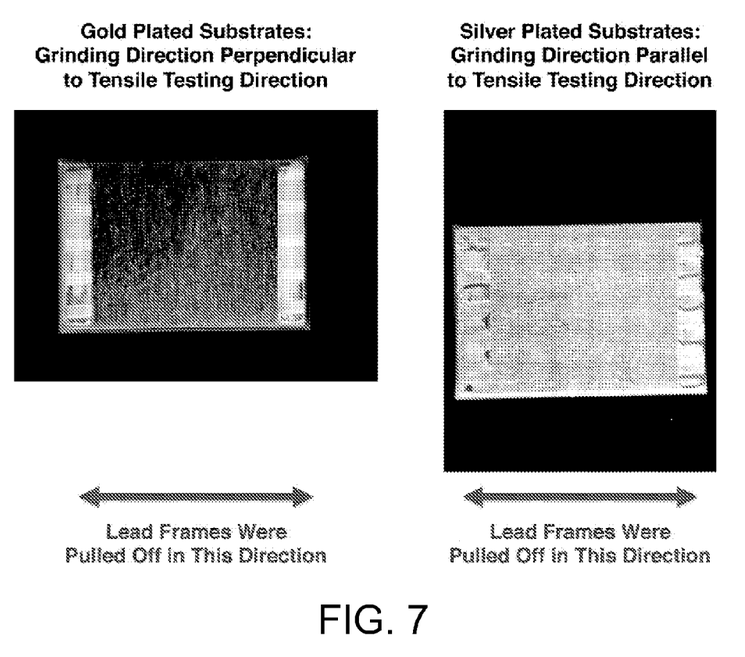
FIG. 7 are test coupons examined for tensile loading response of lead frame silver sintered joints including gold or silver-plating with copper metal modifications.

Review of certain "failed" test coupons shown in FIG. 7 revealed that a difference in the metal surface grinding direction for metal surfaces including gold and silver plating indicated that the direction of the grinding affected the shear strength of the silver sintered joint. The grinding direction for the gold plated coupons was perpendicular to the tensile loading axis of lead frames whereas it was parallel for the silver plated coupons. As such it shows that mechanical adhesion of the sintered silver joints of the lead frames was higher when the grinding direction is perpendicular to the axis of tensile loading versus when the grinding and axis of tensile loading are parallel.

Altering the surface characteristics of copper cladding on substrates increases the shear strength of silver sintered joints. An alteration of the copper surface, which can concomitantly act to increase the adhesion strength of the silver-plating-copper-cladding interface, provided the greatest increase in shear strength; uniaxial grinding and introducing a grid pattern in the copper cladding promoted that strengthening.

The strengths of the uniaxial ground and grid sliced sets were particularly attractive for two reasons. Their average strengths were the highest of all the sets but, perhaps more noteworthy, their minimum failure shear stresses were almost as high as the highest failure shear stresses from all the other sets. From a reliability perspective, having a high-valued minimum failure stress is significant.

Figure 6:
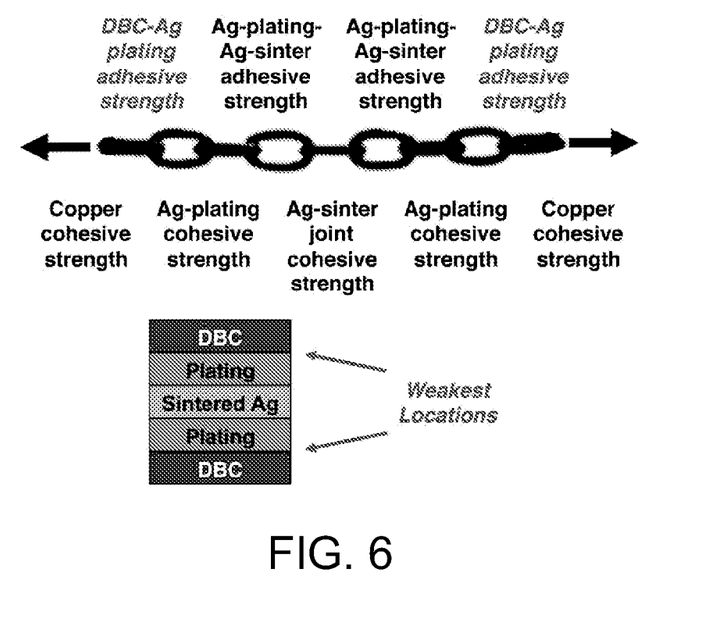
FIG. 6 is a weakest-link-in-the-chain analogy representing shear failures and this invention's identification of adhesive strength between the silver plating and DBC copper cladding being the weakest.

The sintered silver joint is a combination of several layers and interfaces. Its "system" may be represented by what is schematically shown in FIG. 6. Maximum achievable stress of the entire joint will only be as strong as the weakest portion of that joint. Those portions consist of several adhesive strengths and cohesive strengths. This consistent location of failure means that the silver sinter paste and employed processing conditions of this invention produced a cohesive strength of the sintered joint that was stronger than the adhesive strength of the silver-plating-copper-cladding interface. Therefore, further sought increases in joint strength can only be achieved if the adhesive strength of the silver-plating-copper-cladding interface is increased.

The shear strength of the sintered joint with polished copper surfaces is illustrative of the deconvoluted chemical adhesive bond strength in the joint. Its average shear strength was approximately 10 MPa. The higher shear strengths achieved with all other surface modifications is believed to be a consequence of additive strength from mechanical bonding with a roughened surface.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

I claim:

1. A sintered silver bonded electronic packaging subcomponent comprising:
   a first electronic subcomponent comprising
      a first substrate;
      a first metal layer having a first metal surface and a second metal surface with the second metal surface formed on or connected to the first substrate, wherein the first metal surface includes a modified topography to increase a roughness of the first metal surface, wherein the modified topography of the first metal surface of the first metal layer is uniaxially ground, grid sliced, grit blasted or chemically etched; and
   a first silver plating layer formed on the modified first metal surface, wherein the increased roughness of the modified first metal surface increases mechanical interlocking of the first silver plating to the modified surface of the first metal surface;
   a second electronic subcomponent comprising
      a second substrate;
      a second metal layer having a first metal surface and a second metal surface with the second metal surface formed on or connected to the second substrate; and
   a sintered silver joint connecting the first electronic subcomponent to the second electronic subcomponent at the first silver plating layer and the second metal layer.

2. The sintered silver bonded electronic packaging subcomponent of claim 1 further comprising a second silver plating layer formed on the first metal surface of the second metal layer such that the sintered silver joint connects the first electronic subcomponent to the second electronic subcomponent at the first and second silver plating layers.

3. The sintered silver bonded electronic packaging subcomponent of claim 1 wherein the first metal surface of the second metal layer includes a modified topography to increase the roughness of the first metal surface of the second metal layer, wherein the increased roughness of the modified first metal surface of the second metal layer increases mechanical interlocking of the second silver plating to the modified surface of the first metal surface of the second metal layer.

4. The sintered silver bonded electronic packaging subcomponent of claim 1 wherein the modified topography of the first metal surface of the first metal layer is uniaxially ground.

5. The sintered silver bonded electronic packaging subcomponent of claim 3 wherein the modified topography of the first metal surface of the second metal layer is uniaxially ground.

6. The sintered silver bonded electronic packaging subcomponent of claim 1 wherein the modified topography of the first metal surface of the first metal layer is grid sliced.

7. The sintered silver bonded electronic packaging subcomponent of claim 3 wherein the modified topography of the first metal surface of the second metal layer is grid sliced.

8. The sintered silver bonded electronic packaging subcomponent of claim 1 wherein the modified topography of the first metal surface of the first metal layer is grit blasted.

9. The sintered silver bonded electronic packaging subcomponent of claim 3 wherein the modified topography of the first metal surface of the second metal layer is grit blasted.

10. The sintered silver bonded electronic packaging subcomponent of claim 6 wherein the modified topography of the first metal surface of the first metal layer is grid sliced in a crisscross configuration.

11. The sintered silver bonded electronic packaging subcomponent of claim 3 wherein the modified topography of the first metal surface of the second metal layer is chemically etched.

12. The sintered silver bonded electronic packaging subcomponent of claim 4 wherein the uniaxially ground first metal surface has uniaxial channels formed therein and the channels of the first electronic subcomponent first metal surface are positioned perpendicular to a tensile force direction to be experienced by the bonded first and second electronic subcomponents.

13. The sintered silver bonded electronic packaging subcomponent of claim 1 wherein the first electronic subcomponent comprises a direct bonded copper or a direct bonded aluminum device.

14. A sintered silver bonded electronic packaging subcomponent comprising:
   a first electronic subcomponent comprising
      a first substrate;
      a first metal layer having a first metal surface and a second metal surface with the second metal surface formed on or connected to the first substrate, wherein the first metal surface includes a modified topography to increase a roughness of the first metal surface; and
      a first silver plating layer formed on the modified first metal surface, wherein the increased roughness of the modified first metal surface increases mechanical interlocking of the first silver plating to the modified surface of the first metal surface;
   a second electronic subcomponent comprising
      a second substrate;
      a second metal layer having a first metal surface and a second metal surface with the second metal surface formed on or connected to the first substrate, wherein the first metal surface of the second metal layer includes a modified topography to increase a roughness of the first metal surface of the second metal layer;
      a second silver plating layer formed on the modified first metal surface of the second metal layer, wherein the increased roughness of the modified first metal surface of the second metal layer increases mechanical interlocking of the second silver plating to the modified surface of the first metal surface of the second metal layer;
   a sintered silver joint connecting the first electronic subcomponent to the second electronic subcomponent at the first silver plating layer and the second metal layer; and
   wherein the sintered silver joint has a higher shear strength as compared to a sintered silver joint of the first electronic subcomponent connected to the second electronic subcomponent having unmodified first metal surfaces of the first and the second metal layers.

15. A method of bonding electronic subcomponents comprising:
   providing a first electronic subcomponent comprising a substrate, a first metal layer having a first metal surface and a second metal surface with the second metal surface formed on or connected to the substrate;

modifying the topography of the first metal surface of the first metal layer;

providing a second electronic subcomponent having a second metal layer having a first metal surface and a second metal surface;

applying a silver paste to the first metal surface of the first or the second electronic subcomponent;

pressing the second electronic subcomponent to the first electronic subcomponent with the silver paste therebetween; and sintering the first and second electronic subcomponents with the silver paste therebetween forming a sintered silver joint connecting the first electronic subcomponent to the second electronic subcomponent.

16. The method of claim 15 further comprising plating the first metal surfaces of the first and second metal layers before applying the silver paste thereto.

17. The method of claim 16 further comprising modifying the first metal surface of the first metal layer by uniaxially grinding the first metal surface before plating the first metal surface.

18. The method of claim 16 further comprising modifying the first metal surface of the first metal layer by grit blasting the first metal surface before plating the first metal surface.

19. The method of claim 16 further comprising modifying the first metal surface of the first metal layer by grid slicing the first metal surface before plating the first metal surface.

20. The method of claim 19 further comprising modifying the first metal surface of the first metal layer by grid slicing the first metal surface in a crisscross pattern.

* * * * *